United States Patent
Zhao et al.

(10) Patent No.: US 11,043,897 B2
(45) Date of Patent: Jun. 22, 2021

(54) CURRENT REGULATOR

(71) Applicant: Dialog Semiconductor (UK) Limited, London (GB)

(72) Inventors: Xiaogang Zhao, Beijing (CN); Zhenyu Song, Beijing (CN); Huibin Cao, Tianjin (CN); Libo Zhou, Beijing (CN)

(73) Assignee: Dialog Semiconductor (UK) Limited, London (GB)

( * ) Notice: Subject to any disclaimer, the term of this patent is extended or adjusted under 35 U.S.C. 154(b) by 6 days.

(21) Appl. No.: 16/214,876

(22) Filed: Dec. 10, 2018

(65) Prior Publication Data
US 2020/0127564 A1     Apr. 23, 2020

(30) Foreign Application Priority Data

Oct. 17, 2018  (CN) .......................... 201811206740.5

(51) Int. Cl.
| | |
|---|---|
| *H02M 3/157* | (2006.01) |
| *G01R 19/00* | (2006.01) |
| *H03F 3/45* | (2006.01) |
| *G05F 1/10* | (2006.01) |
| *H02M 1/00* | (2006.01) |

(52) U.S. Cl.
CPC ........ *H02M 3/157* (2013.01); *G01R 19/0092* (2013.01); *G05F 1/10* (2013.01); *H03F 3/45632* (2013.01); *H02M 2001/0009* (2013.01); *H03K 2217/0027* (2013.01)

(58) Field of Classification Search
None
See application file for complete search history.

(56) References Cited

U.S. PATENT DOCUMENTS

| | | | | |
|---|---|---|---|---|
| 6,304,066 B1 * | 10/2001 | Wilcox | ............... | H02M 3/1588 323/282 |
| 6,720,745 B2 * | 4/2004 | Lys | ....................... | A61N 5/0616 315/294 |
| 6,847,169 B2 * | 1/2005 | Ito | .......................... | H05B 45/37 315/77 |
| 7,218,168 B1 * | 5/2007 | Rahman | .................... | G05F 1/56 323/273 |
| 7,308,296 B2 * | 12/2007 | Lys | ....................... | A61N 5/0616 600/407 |
| 7,362,131 B2 * | 4/2008 | Balasubramanian | .. | G01K 7/015 326/32 |
| 7,733,034 B2 * | 6/2010 | Kotikalapoodi | ....... | H05B 45/46 315/294 |
| 7,919,925 B2 * | 4/2011 | Ito | ....................... | H05B 45/385 315/82 |

(Continued)

FOREIGN PATENT DOCUMENTS

| | | |
|---|---|---|
| CN | 207489446 | 6/2018 |
| EP | 1 659 830 | 5/2006 |

*Primary Examiner* — Amy Cohen Johnson
*Assistant Examiner* — Srinivas Sathiraju
(74) *Attorney, Agent, or Firm* — Saile Ackerman LLC; Stephen B. Ackerman

(57) ABSTRACT

A current regulator and a method for regulating a current flowing through a device such as a semiconductor light source is presented. The current regulator has a voltage controller coupled to a current steering circuit. The voltage controller is adapted to operate the current steering circuit in a linear mode.

14 Claims, 8 Drawing Sheets

(56) References Cited

U.S. PATENT DOCUMENTS

| | | | | |
|---|---|---|---|---|
| 8,045,066 B2* | 10/2011 | Vorenkamp | H03H 7/25 | 348/726 |
| 8,212,608 B2* | 7/2012 | Larsen | H03F 1/305 | 327/541 |
| 8,362,639 B2* | 1/2013 | Nagase | H05B 45/10 | 307/10.8 |
| 8,441,382 B2* | 5/2013 | Mahajan | H03K 17/063 | 341/136 |
| 8,618,867 B2* | 12/2013 | Singnurkar | H02M 3/07 | 327/536 |
| 8,710,810 B1* | 4/2014 | McJimsey | H02M 3/157 | 323/272 |
| 8,810,153 B2* | 8/2014 | Yoshio | H05B 45/37 | 315/294 |
| 8,890,429 B2* | 11/2014 | Fukuda | H05B 45/50 | 315/224 |
| 8,890,737 B2* | 11/2014 | Schrom | G01R 19/0092 | 341/144 |
| 9,220,139 B2* | 12/2015 | Williams | H05B 45/397 | |
| 9,307,590 B2* | 4/2016 | Negru | H05B 33/0809 | |
| 9,392,661 B2* | 7/2016 | Schiappelli | H05B 45/37 | |
| 9,407,268 B1* | 8/2016 | Hsu | H03K 19/018528 | |
| 9,419,636 B1* | 8/2016 | Graham | H03M 1/0836 | |
| 9,450,595 B2* | 9/2016 | Cali | H03M 1/66 | |
| 9,451,664 B2* | 9/2016 | Jin | H05B 45/38 | |
| 9,500,678 B2* | 11/2016 | Williams | H01L 23/49575 | |
| 9,531,265 B1* | 12/2016 | Voigtlander | H02M 3/158 | |
| 9,541,933 B2* | 1/2017 | Knoedgen | G05F 1/575 | |
| 9,548,752 B1* | 1/2017 | Shrivastava | H03M 1/745 | |
| 9,660,590 B2* | 5/2017 | Kim | H02M 3/07 | |
| 9,698,806 B2* | 7/2017 | Zhu | H03M 1/664 | |
| 9,733,282 B2* | 8/2017 | Schrom | G01R 19/0092 | |
| 9,735,797 B2* | 8/2017 | Zhao | H03M 1/1038 | |
| 9,810,723 B2* | 11/2017 | Pan | G01R 19/0092 | |
| 9,960,675 B2* | 5/2018 | Almukhtar | H02M 3/156 | |
| 9,970,994 B2* | 5/2018 | Ikawa | H05B 45/58 | |
| 9,979,385 B2* | 5/2018 | Sandhu | G11C 13/004 | |
| 10,003,349 B2* | 6/2018 | Zhu | H03M 1/002 | |
| 10,048,714 B2* | 8/2018 | Zhu | G05F 3/02 | |
| 10,248,150 B2* | 4/2019 | Narayanan | H05B 45/325 | |
| 10,284,215 B2* | 5/2019 | Zhu | H03M 1/002 | |
| 2002/0125872 A1* | 9/2002 | Groom | H02M 3/156 | 323/288 |
| 2006/0181305 A1* | 8/2006 | Balasubramanian | G06F 15/7867 | 326/38 |
| 2007/0030055 A1* | 2/2007 | Hasegawa | G05F 1/575 | 327/543 |
| 2007/0188759 A1* | 8/2007 | Mehendale | G01N 21/72 | 356/409 |
| 2008/0084196 A1* | 4/2008 | Lacombe | H05B 39/047 | 323/282 |
| 2010/0045368 A1* | 2/2010 | Ito | H01L 23/50 | 327/540 |
| 2010/0085025 A1* | 4/2010 | Kato | H02M 3/157 | 323/282 |
| 2010/0106231 A1* | 4/2010 | Torgerson | A61N 1/36082 | 607/116 |
| 2010/0148735 A1* | 6/2010 | Napravnik | G05F 1/575 | 323/280 |
| 2010/0194443 A1* | 8/2010 | Akyol | G05F 3/262 | 327/103 |
| 2010/0277239 A1* | 11/2010 | Mukhopadhyay | H03F 3/45183 | 330/257 |
| 2011/0254828 A1* | 10/2011 | Wadhwa | G05F 1/565 | 345/212 |
| 2012/0161728 A1* | 6/2012 | Chen | H02M 3/1563 | 323/271 |
| 2012/0268026 A1* | 10/2012 | Crawford | H05B 45/3725 | 315/210 |
| 2012/0280667 A1* | 11/2012 | Drebinger | G05F 1/575 | 323/273 |
| 2013/0049611 A1* | 2/2013 | Wadhwa | G05F 1/565 | 315/175 |
| 2013/0221940 A1* | 8/2013 | Yan | G05F 1/565 | 323/273 |
| 2013/0271095 A1* | 10/2013 | Jackum | G05F 1/56 | 323/270 |
| 2014/0055110 A1* | 2/2014 | Richter | G05F 1/565 | 323/281 |
| 2014/0070876 A1* | 3/2014 | Paillet | G05F 1/56 | 327/538 |
| 2014/0152362 A1* | 6/2014 | Zhao | H03K 3/017 | 327/175 |
| 2014/0266832 A1* | 9/2014 | Schrom | G06T 3/40 | 341/144 |
| 2015/0069995 A1* | 3/2015 | Schrom | G01R 19/0092 | 324/76.11 |
| 2016/0066371 A1* | 3/2016 | Negru | H05B 33/0809 | 315/291 |
| 2017/0030947 A1* | 2/2017 | Schrom | G06T 3/40 | |
| 2017/0033688 A1* | 2/2017 | Nikitin | H02M 3/157 | |
| 2017/0070149 A1* | 3/2017 | Guan | H02M 1/32 | |
| 2017/0127488 A1* | 5/2017 | Wang | H05B 45/10 | |
| 2017/0237345 A1* | 8/2017 | Manlove | H02M 1/32 | 323/274 |
| 2017/0272089 A1* | 9/2017 | Zhu | H03M 1/0863 | |
| 2017/0316834 A1* | 11/2017 | Huynh | G11C 16/3459 | |
| 2018/0248558 A1* | 8/2018 | Zhu | H03M 1/0863 | |
| 2018/0259988 A1* | 9/2018 | Nerad | H02M 3/157 | |
| 2018/0348806 A1* | 12/2018 | Zhu | G05F 3/02 | |
| 2019/0025865 A1* | 1/2019 | Narayanan | H03F 3/195 | |
| 2019/0140632 A1* | 5/2019 | Song | H02M 3/156 | |
| 2019/0208589 A1* | 7/2019 | Satterfield | H05B 45/35 | |
| 2020/0127564 A1* | 4/2020 | Zhao | H03F 3/345 | |

* cited by examiner

| Device | Work Region | Std Dev (%) |
|---|---|---|
| 3.3v Nmos | Saturation | 15.8 |
| | Linear | 6.2 |
| 5v Nmos | Saturation | 12.2 |
| | Linear | 4.5 |
| | Deeper Linear | 4.1 |

Note:
Same condition, 1u/10u size, current=1uA

FIG. 7

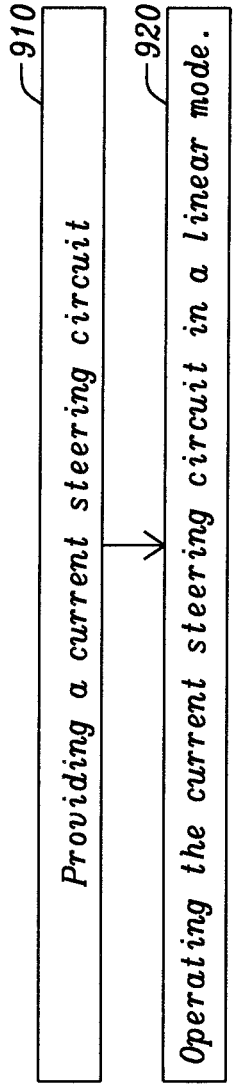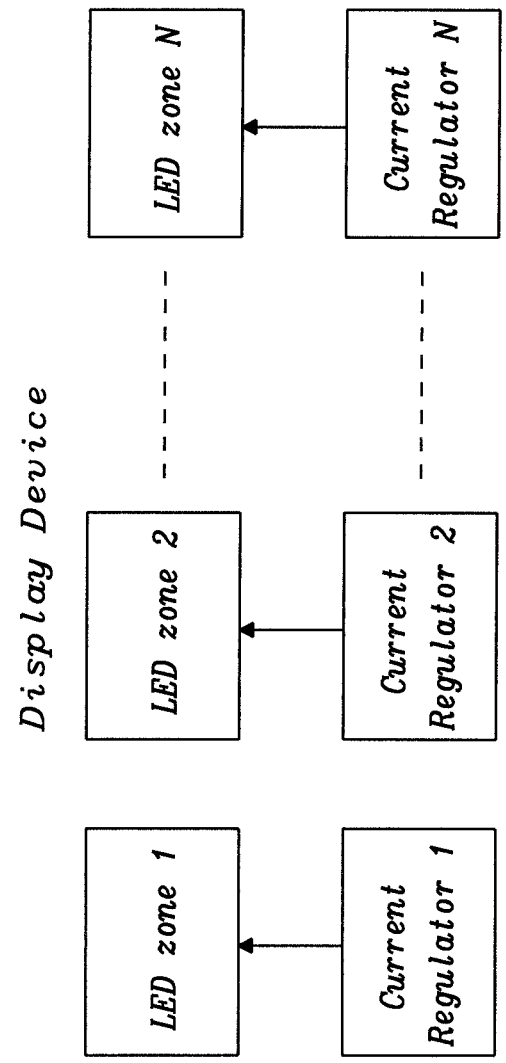

CURRENT REGULATOR

TECHNICAL FIELD

The present disclosure relates to a current regulator. In particular, the present disclosure relates to a current regulator comprising a current Digital to Analog Converter iDAC for regulating a current flowing through a device such as a semiconductor light source.

BACKGROUND

High-Dynamic Range displays, based on Light-emitting diode (LED) back-lighting technology, require a large number of LED zones to achieve a high contrast ratio between bright and dark images. Each LED zone also referred to as LED channel can be used to achieve local dimming and create realistic images. Each LED channel requires a current-steer Digital to Analog Converter DAC for individual current control. Conventional current DACs have a large saturated output voltage which increases power consumption. In addition, these circuits have a relatively large footprint.

SUMMARY

It is an object of the disclosure to address one or more of the above-mentioned limitations. According to a first aspect of the disclosure, there is provided a current regulator comprising a voltage controller coupled to a current steering circuit; the voltage controller being adapted to operate the current steering circuit in a linear mode.

Optionally, the current steering circuit comprises a plurality of current cells; wherein each cell operates in a linear mode.

Optionally, the voltage controller comprises a current source coupled to a first switch having a first terminal, a second terminal and a third terminal; and the voltage controller is adapted to provide a control voltage to the first terminal to operate the first switch in linear mode.

For example, the first terminal may be a gate terminal, the second terminal a drain terminal and the third terminal a source terminal. The control voltage may be maintained above a threshold value.

Optionally, the voltage controller comprises a first differential amplifier adapted to provide the control voltage; and wherein the first differential amplifier has an input coupled to the second terminal to regulate the voltage at the second terminal of the first switch.

Optionally, the voltage controller comprises a second differential amplifier coupled to a second switch having a first terminal, a second terminal and a third terminal; wherein the second differential amplifier has an input coupled to a third terminal of the second switch to regulate the voltage at the third terminal of the second switch.

Optionally, the current steering circuit has an input coupled to the third terminal of the first switch and an output coupled to the third terminal of the second switch.

Optionally, the current steering circuit comprises a plurality of current cells, and wherein each current cell has a first end coupled to the input and a second end coupled to the output.

Optionally, the current cells comprise at least one unary cell, the unary cell comprising a single transistor having a first terminal coupled to the input and a second terminal coupled to the output.

Optionally, the current cells comprise at least one a binary cell, the binary cell comprising a set of transistors coupled in series, wherein a first transistor in the set of transistors is coupled to the input and wherein a last transistor in the set of transistors is coupled to the output.

Optionally, the current regulator comprises a decoder coupled to the current steering circuit; the decoder being configured to provide a plurality of control signals to operate the current cells.

According to a second aspect of the disclosure, there is provided a semiconductor light source driver comprising a current regulator as defined according to the first aspect.

According to a third aspect of the disclosure, there is provided a device comprising a current regulator as defined according to the first aspect; and a semiconductor light source coupled to the current regulator, the current regulator being operable for regulating a current flowing through the semiconductor light source.

Optionally, the device is a display device comprising a plurality of semiconductor light sources, each semiconductor light source among the plurality of light sources being coupled to a corresponding current regulator.

The options described with respect to the first aspect of the disclosure are also common to the second and third aspect of the disclosure.

According to a fourth aspect of the disclosure, there is provided a method of regulating a current, the method comprising providing a current steering circuit; and operating the current steering circuit in a linear mode.

Optionally, the current steering circuit comprises a plurality of current cells; and wherein each current cell operates in a linear mode.

The method according to the fourth aspect of the disclosure may share features of the first aspect as noted above and herein.

BRIEF DESCRIPTION OF THE DRAWINGS

The disclosure is described in further detail below by way of example and with reference to the accompanying drawings, in which:

FIG. 7 is a table illustrating current standard deviations for transistors working in different operational regions;
FIG. 9 is a flow chart of a method for regulating a current;
FIG. 10 is a display device.

DESCRIPTION

Figures 1, 2:
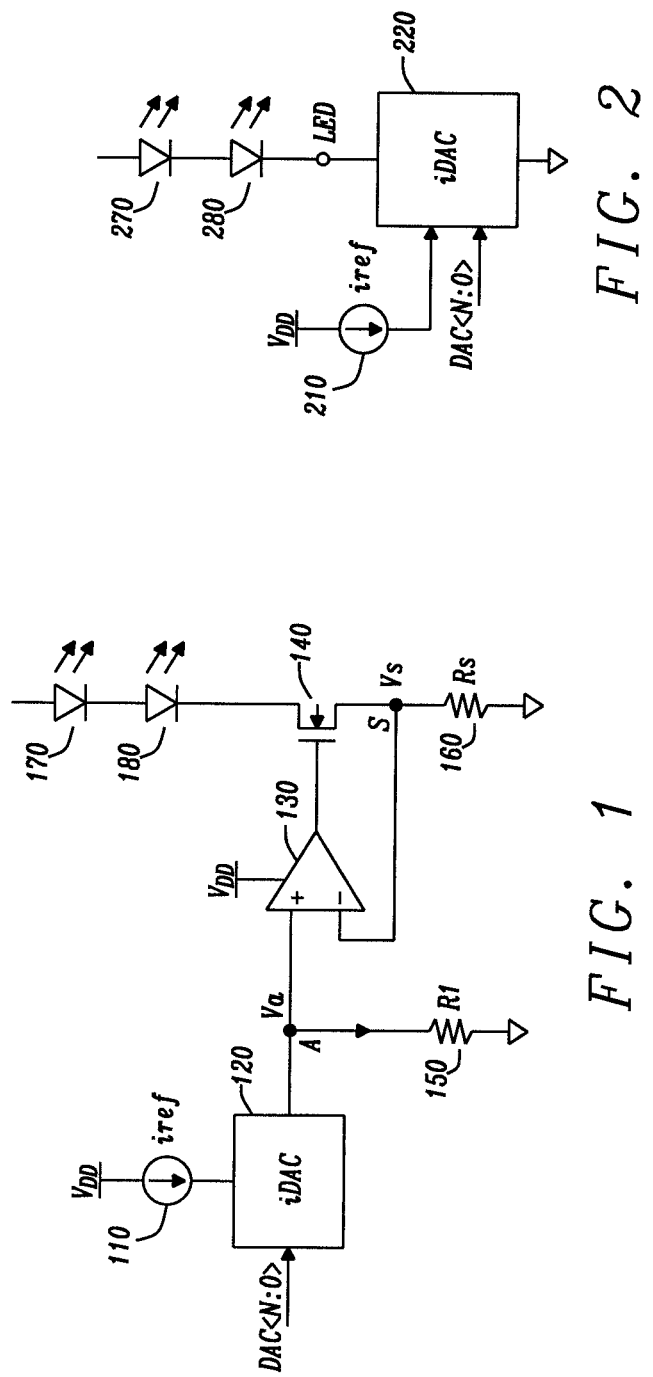
FIG. 1 is a diagram of a conventional LED driver circuit.
FIG. 2 is diagram of another LED driver circuit.

FIG. 1 illustrates a conventional driver for driving an LED or a string of LEDs. The driver includes a current source 110 coupled to a current digital to analog converter iDAC 120, an operational amplifier op-amp 130 coupled to a transistor 140. The op-amp 130 has a non-inverting input connected to the output of the current DAC 120, an inverting input connected to the source terminal of the transistor 140 and an output connected to the gate terminal of transistor 140. The current DAC 120 has an output coupled to the ground via a resistor R1 150. The transistor 140 has a drain terminal coupled to the LEDs 180, 170 and a source terminal coupled to ground via a resistor Rs 160 at node S.

In operation, the current DAC 120 receives a digital signal and outputs a current that is transformed into a voltage Va at node A. The op-amp 130 provides a control signal that is proportional to the difference between the voltages Va at node A and Vs at node S. The control signal provides a gate voltage to the transistor 140. When the voltage is above the threshold value of the transistor 140 a current Iled passes through the transistor and through the LEDs 170, 180.

The circuit of FIG. 1 is cumbersome and consumes a relatively large amount of current. The minimum LED current Iled achieved by the circuit of FIG. 1 is also relatively large, hence limiting the sensitivity with which light intensity may be controlled. The voltage Vs decreases as the LED current decreases. The op-amp 130 requires a non-inverting voltage above a certain value in order to operate properly. At low Vs, the op-amp 130 becomes less reliable and therefore controls the gate voltage of the transistor 140 with less accuracy, hence causing large LED current errors.

FIG. 2 illustrates a driver for driving a set of LEDs. The driver includes a current source 210 coupled to a current DAC 220. In this circuit, the output of the current DAC is directly coupled to the LEDs 270, 280. In operation, the current DAC 220 receives a digital signal which controls the output current of the current DAC 220. This current is the current Iled flowing through the LEDs 270, 280. In the circuit of FIG. 2, there is no need for an op-amp or a sensing resistor. Therefore, the circuit is simpler, smaller and requires less power consumption. The minimum LED current that can be achieved depends on the particular implementation of the current DAC 220.

In the circuit of FIG. 2, the current DAC 220 is provided as a current sink, however, it will be appreciated that in another embodiment, the current DAC 220 may be provided as a current source.

Figure 3:
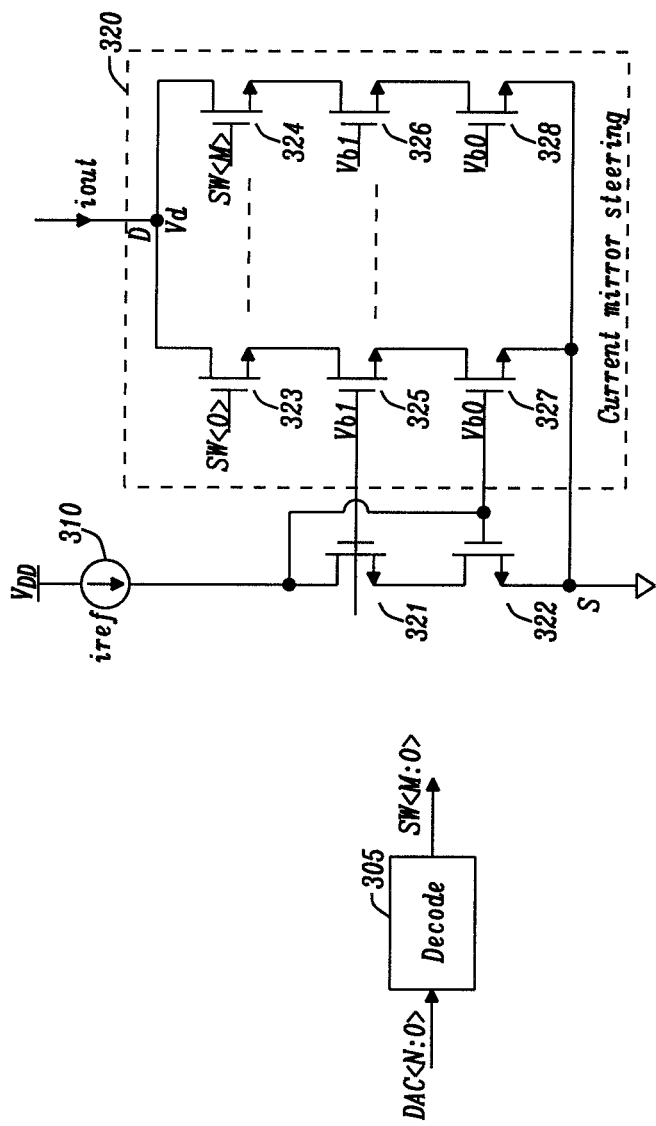
FIG. 3 is an exemplary embodiment of the circuit of FIG. 2.

FIG. 3 illustrates an exemplary current DAC for use in the circuit of FIG. 2. The current DAC is coupled to a current source 310 via transistors 321, 322. The transistors 321, 322 are connected to a current mirror steering circuit 320 formed by a plurality of current cells. Transistors 323, 325, 327 form a first current cell and transistors 324, 326, 328 form a second current cell. The first and second current cells may be referred to as unary cells; and more unary cells may be provided within the current mirror steering circuit 320.

Each current cell is connected at one end to a node D and at a second end to a node S. For instance, the transistor 323 has a drain terminal coupled to node D, and a source terminal coupled to the drain terminal of transistor 325. The source terminal of transistor 325 is connected to the drain terminal of transistor 327 and the source terminal of transistor 327 is connected to the ground at node S.

The transistors 321, 325, 322, 327 are arranged to form a cascaded current mirror. Stated another way, transistor 321 and transistor 325 form a first current mirror and transistors 322 and 327 form a second current mirror. The gate of transistor 321 is connected to the gate of transistor 325. The gate of transistor 322 is connected to the gate of transistor 327. The drain of transistor 321 is connected to the gate of transistor 321 and the gate of transistor 322.

In operation, the current DAC produces a quantized output current Iout in response to a binary input code, also referred to as digital word. The measure of how the current output may change between discrete steps depends on the resolution of the DAC. For instance, an 8-bits DAC will have a greater resolution than a 3-bits DAC. The output current is generated by dividing the reference current Iref into binary and/or unary (linear) fractions.

The decoder 305 receives the input digital signal and generates control signal to control the switches of the unary and binary cells of the DAC. The control signals drive the switches of the unary and/or binary cells present in the current DAC such that a right number of fractions are combined to produce the output current. The decoder 305 provides a control signal also referred to a switch signal SW that is received at the first transistor of each current cell. For instance, transistor 323 of the first current cell receives a gate control signal SW<0> from the decoder 305. Similarly, the switch 324 receives a gate control signal SW<M>.

The transistors 323 and 324 are operated in a linear region of operation. The remaining transistors 321, 322, 325, 326, 327 and 328 are operated in a saturation region. The output voltage Vd at node D has a saturation value defined as: $V_d = 2V_{ds_{sat}} + V_{ds}$, in which Vds_sat is the drain to source voltage of a switch operated in the saturation region, and Vds is the drain to source voltage in the linear region. For example, the DAC output saturation voltage may be as large as 300 millivolts. As a result, it is difficult to provide a small output value for the current DAC.

Figure 4:
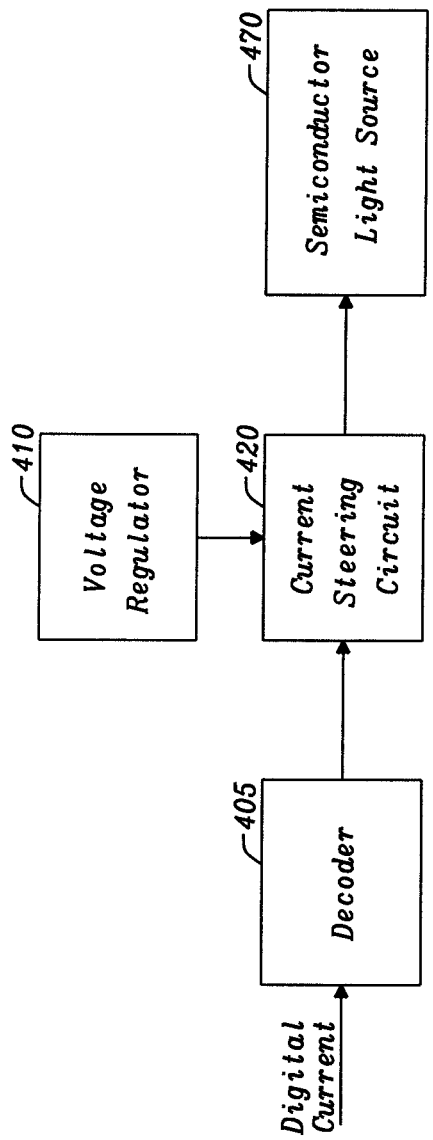
FIG. 4 is a diagram of a current regulator according to the disclosure.

FIG. 4 is a diagram of a regulator according to the disclosure. The system of FIG. 4 includes a decoder 405, a current steering circuit 420, a voltage regulator 410 and a semiconductor light source 470. The decoder 405 has an input for receiving a digital current or a digital signal and an output for providing a control signal to the current steering circuit 420. The current steering circuit 420 has an input for receiving a voltage from the voltage regulator 410. The current steering circuit 420 has an output for providing a current to a device such as a semiconductor light source 470. The current steering circuit 420 includes a plurality of current cells. The current cells may be unary cells, binary cells or a combination of unary and binary cells.

Each current cell may include one or more transistors. The transistors within the current steering circuit are connected to form a large transistor of variable size depending on how many transistors are being activated. For instance, if the transistors of the current steering circuits are metal-oxide-semiconductor field-effect (MOSFET) transistors, all the transistors coupled together in parallel have a unique drain voltage, and a unique source voltage. The gate of each transistor can be controlled individually to determine how many transistors should be activated. Therefore, the large transistor formed by the plurality of MOSFET transistors may be operated in a linear mode, depending on the voltage provided by the voltage regulator 510.

The current regulator may be used to regulate the current in various types of devices. In FIG. 4, the current regulator regulates a current flowing through a semiconductor light source 470. The semiconductor light source 470 may include a plurality of LEDs forming a zone of an LED display. The current regulator may be used as a dimmer to control the brightness of a zone of the display. Each zone (channel) of the display only needs one current DAC to set the LED current. The current DAC may be used either as a current source or a current sink for the LED current.

Figure 5:
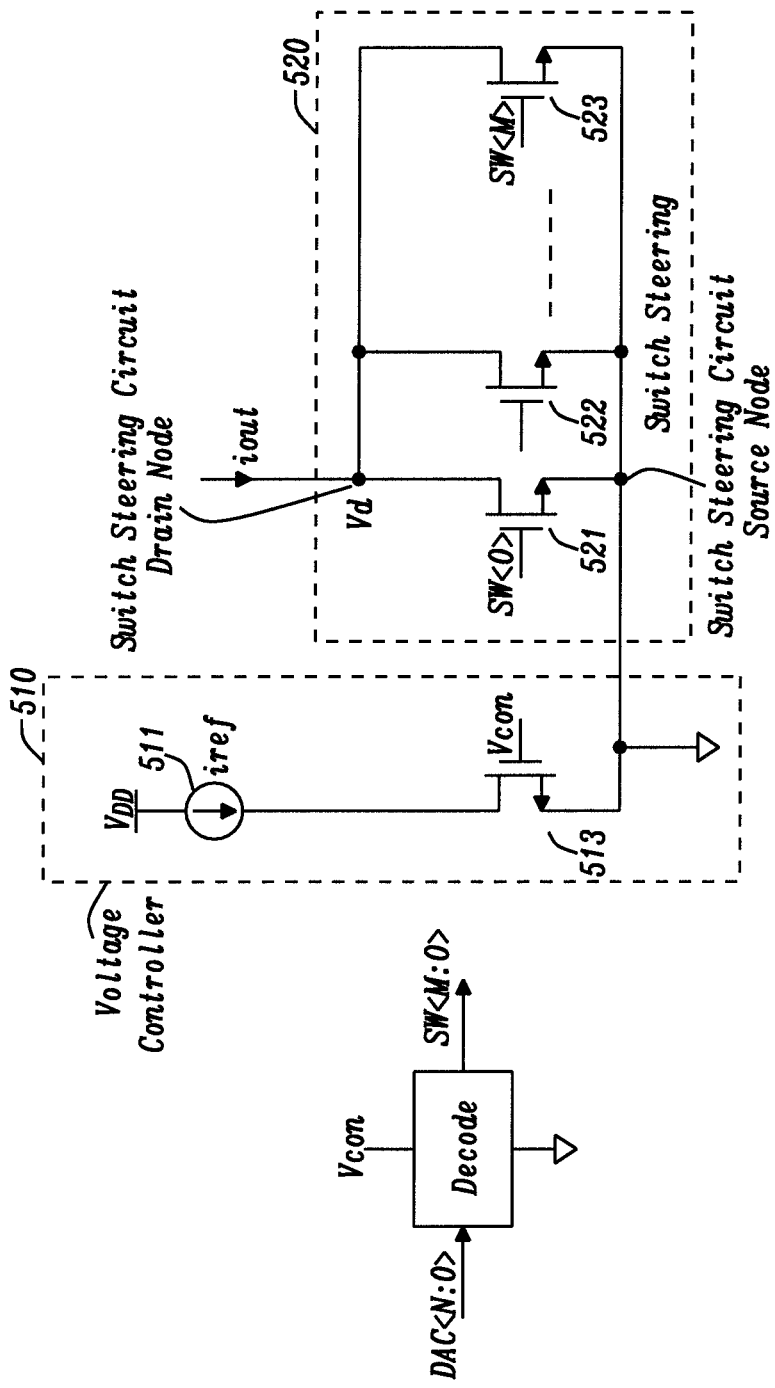
FIG. 5 is an exemplary embodiment of the regulator of FIG. 4.

FIG. 5 is an exemplary embodiment of the regulator of FIG. 4. The current regulator comprises a current steering circuit 520 coupled to voltage controller 510 for operating the current steering circuit in a linear mode. The voltage controller 510 comprises a current source 511 adapted to provide a reference current Iref coupled to a first switch 513. The first switch 513 has a first terminal referred to as control terminal, a second terminal, and a third terminal. For instance, the control terminal may be a gate terminal, the second terminal a drain terminal and the third terminal a source terminal.

In operation the control terminal received a control voltage Vcon to operate the switch 513 in a linear mode. The voltage between the first terminal and the second terminal, for example the gate to source voltage Vgs of switch 513 is maintained above a certain value so that the switch 513 is operated in linear mode. As a result, the switches 521, 522 and 523 provided in the current steering circuit 520 are also operated in a linear mode.

Figure 6:
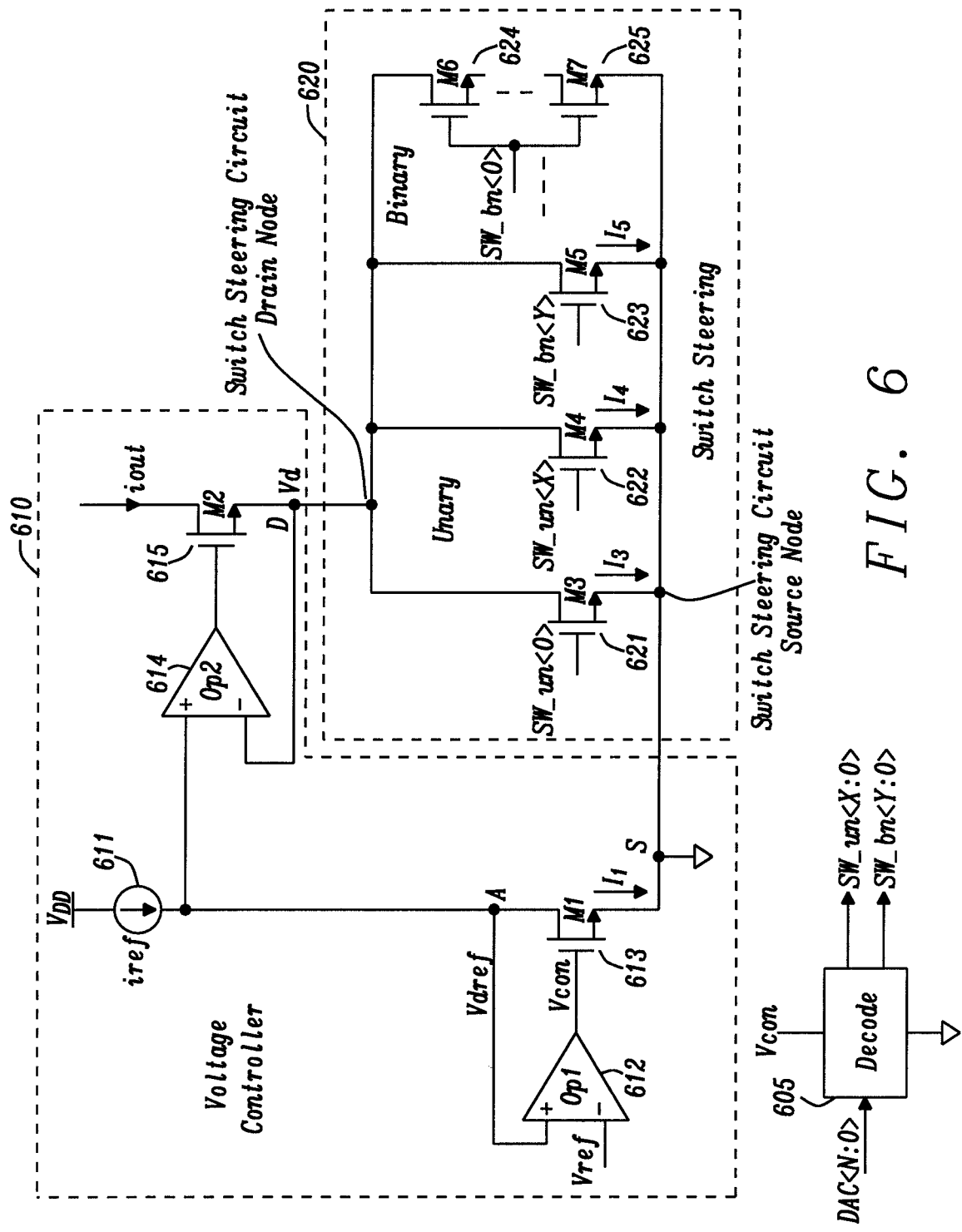
FIG. 6 is another exemplary embodiment of the regulator of FIG. 4.

FIG. 6 is another exemplary embodiment of the regulator of FIG. 4. The system of FIG. 6 includes a voltage regulator 610 coupled to a steering circuit 620. The voltage regulator 610 includes a current source 611, a first differential amplifier 612, a first switch M1 613 as well as a second differential amplifier 614 coupled to a second switch M2 615. The first and second differential amplifiers, in this example, are provided by an operational amplifier or op-amp. The first op-amp 612 has a non-inverting input coupled to the current source 611 at node A, and an inverting input coupled to a reference voltage. The output of the first op-amp 612 is coupled to a control terminal, such as a gate terminal, of the switch 613. The drain terminal of the switch 613 is coupled to the current source 611 at node A, and the source terminal of the switch 613 is coupled to a ground terminal. The second op-amp 614 has a non-inverting input connected to the current source 611 and an inverting input coupled to the source terminal of second switch 615. The circuit 620 includes three unary cells and one binary cell. However, it would be appreciated that the circuit 620 may be made only of unary cells or only of binary cells or of a combination of unary and binary cells.

In the example of FIG. 6, the transistors are provided by N-channel metal-oxide semiconductor field effect transistors referred to as NMOS transistors. The first unary cell is provided by a single transistor M3 621 having a drain terminal coupled to the source terminal of the switch 615 at node D, and a source terminal coupled to ground at node S. The gate terminal of the transistor 621 is configured to receive a control signal from the decoder 605. Similarly, a second unary cell includes a single transistor M4 622 having a drain terminal coupled to the node D, a source terminal coupled to ground, and a gate terminal configured to receive a control signal from the decoder 605.

A binary cell is also provided that includes a first transistor 624 connected in series with a second transistor 625. The first transistor 624 has a drain terminal coupled to the node D and a source terminal coupled to the drain terminal of transistor 625. The source terminal of transistor 625 is connected to the ground. The gate terminals of transistor 624 and transistor 625 are coupled together and configured to receive a control signal from the decoder 605. The binary cell may include $2^N$ transistors coupled in series, in which N is an integer. For instance, a binary cell may include four or eight transistors coupled in series.

Considered together, the transistors M3 621, M4 622, M5 623, M6 624 and M7 625 form a single large transistor having a single drain terminal, Node D, a single gate terminal, and a single ground terminal Node S. This large transistor may have a variable size depending on how many transistors among transistors 621, 622, 623, 624 and 625 are being activated.

In operation, the current source 611 provides a reference current Iref. The first op-amp 612 receives a first voltage Vdref at its non-inverting input, and a second voltage Vref at its inverting input. The op-amp 612 provides a voltage signal, also referred to as control voltage Vcon, proportional to the difference between Vref and Vdref. The control voltage Vcon controls the gate of the switch 613 and regulates the amount of current going through 613. Therefore, the first op-amp 612 regulates the voltage Vdref at node A so that it remains substantially equal to Vref. Similarly, the second amplifier 614 regulates the voltage at node D such that Vd is substantially equal to Vdref and therefore substantially equal to Vref.

The voltage at node D is regulated to suppress potential variations caused by differences in fabrication parameters, temperature and other artefacts. The decoder 605 receives a digital signal and provides a plurality of control signals also referred to as switch signals SW for controlling the switches 621, 622, 623, 624 and 625 depending on the digital signal received by the decoder 605.

The digital decoder 605 also receives the control voltage Vcon generated by the first op-amp 612; and each control signal SW is a function of the control voltage Vcon. The switch signals SWs control how many current cells are turned on or turned off. A switch signal SW is a logic signal which is either high or low. For instance, when the switch signal is high it may be equal to Vcon, hence turning on the current cell; and when the switch signal is low it may be equal to zero, hence turning off the current cell.

Therefore, in operation, the first op-amp 612 together with the switch 613 controls the gate to source voltage Vgs of the steering current circuit 620. The voltage Vgs is regulated so that the current steering circuit 620 operates in a linear mode. Stated another way the control voltage Vcon is high enough to permit the MOS transistors of the current steering circuit 620 to work in the linear region.

The control voltage Vcon=Vg(M1) applied to the gate of M1 is maintained above a threshold value (the threshold value being greater than a threshold voltage Vth of M1) to operate M1 in a linear mode. The drain voltage Vd(M1) at node A is maintained sufficiently low to operate M1 in a linear mode. Stated another way the drain to source voltage of M1 Vds(M1) is maintained below a threshold value in order to operate M1 in a linear mode. If the transistors M1 and M3 have a same size, then M1 and M3 have the same gate-source voltage Vgs, and the same drain to source voltage Vds (Vds(M1)=Vds(M3) and Vgs(M1)=Vgs(M3)). Hence, the current I1 flowing through M1 is equal to the current I3 flowing through M3.

Binary cells can be used to generate smaller currents than unary cells and increase the accuracy of the output current. A current I6 flowing through the binary cell will depend on the number of transistors provided in series. If the binary cell includes two transistors M6 and M7 having the same size as M1, then I6=I1/2. More generally I6=I1/number of transistors provided in the binary cell.

The circuit of FIG. 6 provides numerous advantages. Firstly, the output saturation voltage of the current DAC now depends on the drain to source voltage of the MOS transistors in the linear region, which is less than the drain to source voltage in the saturation region. The drain to source resistance Rds_on of a transistor operated in a linear region is much smaller than a transistor of the same size operated in the saturation region. As a result, it is possible to achieve much lower values of output saturation voltage for the DAC and therefore to generate lower output currents. As a numerical example, it may be possible to achieve an output saturation that is less than 200 millivolts. Secondly, the circuit of FIG. 6 has a smaller footprint. The switching current circuit 620 may be provided with unary cells that only require a single transistor operated in the linear region. This is in contrast with the prior art that requires multiple transistors operated in saturation. Since the transistors of the current cells are operated in the linear region, it is possible to use smaller transistors for the same current characteristics.

FIG. 7 illustrates the standard deviation of a 1 μA current flowing through a NMOS transistor operated either in saturation mode or in the linear mode. For a 3.3V NMOS transistor, it can be observed that the current has a standard deviation of 15.8% when operated in saturation mode and 6.2% when operated in linear mode. For a 5V NMOS transistor, the current has a standard deviation of 12.2% when operated in saturation mode, 4.5% when operated in linear mode, and 4.1% when operated in deep linear mode.

In a same region of operation, the matching of transistors improves with the size of transistors. The greater the size the better the matching. For transistors having a same size, and for same current conditions, the matching of transistors operating in linear mode is better than the matching of transistors operating in saturation mode. Therefore, for a same level of accuracy (i.e the same standard deviation of current) it is possible to use a smaller transistor, when the transistor is operated in linear mode.

Figure 8:
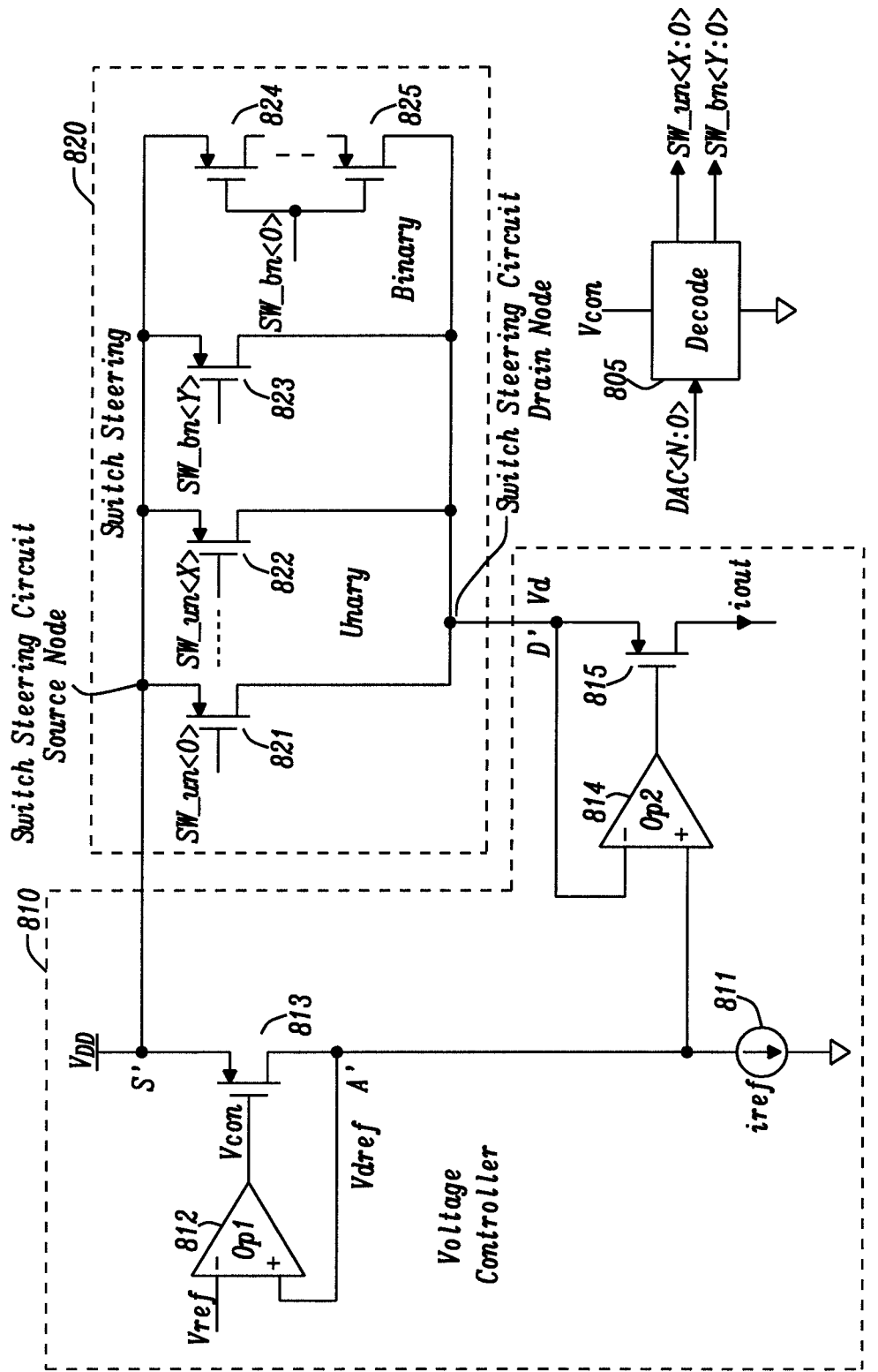
FIG. 8 is another exemplary embodiment of the regulator of FIG. 4.

FIG. 8 illustrates another example of the regulator of FIG. 5. In this case, the voltage regulator 810 and the current steering circuit 820 are implemented using a plurality of P-channel metal-oxide semiconductor field effect transistors PMOS.

The voltage regulator 810 includes a current source 811, a first op-amp 812 coupled to a first transistor 813, and a second op-amp 814 coupled to a second switch 815. The first op-amp 812 has an inverting input coupled to a reference voltage Vref and a non-inverting input coupled to current source 811 at node A'. The output of the first op-amp 812 is coupled to the gate of transistor 813. The second op-amp 815 has a non-inverting input coupled to the current source at node A' and an inverting input coupled to the source of the transistor 815 at node D'. The output of the second op-amp 814 is coupled to the gate of the second transistor 815. The current steering circuit 820 includes a plurality of unary cells as well as a binary cell.

The first current cell includes a single transistor 821 having a source terminal coupled to rail voltage Vdd at node S', a drain terminal coupled to the node D' and a gate terminal configured to receive a control signal from the decoder 805. Similarly, a second transistor 822 is provided to form a second unary cell. The transistor 822 has a source terminal coupled to rail voltage Vdd at node S', a drain terminal coupled to the node D' and a gate terminal configured to receive a control signal from the decoder 805.

A binary cell is provided by transistors 824 and 825 coupled in series. The source of transistor 824 is coupled to the voltage Vdd at node S'. The drain terminal of transistor 824 is coupled to the source terminal of transistor 825 and the drain terminal of transistor 825 is coupled to the Node D'. The gate terminal of transistors 824, 825 are coupled together and configured to receive a control signal from the decoder 805. The circuit of FIG. 8 operates in a similar fashion to the circuit of FIG. 7.

FIG. 9 is a flow chart of a method for regulating a current. At step 910, a current steering circuit is provided. At step 920, the current steering circuit is operated in a linear mode.

FIG. 10 illustrates a display device. The display device comprises a plurality of LED zones. Each LED zone is coupled to a corresponding current regulator as described above with reference to FIGS. 4 to 8.

A skilled person will appreciate that variations of the disclosed arrangements are possible without departing from the disclosure. For instance, it will be appreciated that the current regulator described in the present disclosure could be used in various applications, and as such is not limited to the control of LEDs. Accordingly, the above description of the specific embodiment is made by way of example only and not for the purposes of limitation. It will be clear to the skilled person that minor modifications may be made without significant changes to the operation described.

What is claimed is:

1. A current regulator comprising a voltage controller coupled to a current steering circuit having a drain node, a source node, and a plurality of current cells, each current cell having a gate terminal for receiving a control signal to activate the current cell, a drain terminal coupled to the drain node and a source terminal coupled to the source node; the voltage controller being adapted to operate the plurality of current cells of the current steering circuit in a linear mode; wherein the voltage controller comprises a first switch coupled to the source node, the voltage controller further comprising a current source coupled to the first switch and to a first differential amplifier; the first differential amplifier having an input connected to a drain terminal of the first switch.

2. The current regulator as claimed in claim 1, wherein the first switch has a gate terminal and a source terminal; and wherein the first differential amplifier is adapted to provide a control voltage to the gate terminal, wherein the control voltage is set above a threshold value to operate the first switch in linear mode.

3. The current regulator as claimed in claim 1, wherein the first differential amplifier has a reference input for receiving a reference voltage, the first differential amplifier being adapted to maintain the voltage at the drain terminal of the first switch substantially equal to the reference voltage.

4. The current regulator as claimed in claim 1, wherein the voltage controller comprises a second switch coupled to the drain node, and a second differential amplifier coupled to the second switch, the second switch having a gate terminal, a drain terminal and a source terminal; wherein the second differential amplifier has an input coupled to the source terminal of the second switch to regulate the voltage at the source terminal of the second switch.

5. The current regulator as claimed in claim 4, wherein the source node of the current steering circuit is coupled to the source terminal of the first switch and wherein the drain node is coupled to the source terminal of the second switch.

6. A device comprising a semiconductor light source coupled to a current regulator, the current regulator being operable for regulating a current flowing through the semiconductor light source; wherein the current regulator comprises a voltage controller coupled to a current steering circuit having a drain node, a source node, and a plurality of current cells, each current cell having a gate terminal for receiving a control signal to activate the current cell, a drain terminal coupled to the drain node and a source terminal coupled to the source node; the voltage controller being adapted to operate the plurality of current cells of the current steering circuit in a linear mode; wherein the voltage controller comprises a first switch coupled to the source node, the voltage controller further comprising a current source coupled to the first switch and to a first differential amplifier; the first differential amplifier having an input connected to a drain terminal of the first switch.

7. The current regulator as claimed in claim 1, wherein the current cells comprise at least one unary cell, the unary cell comprising a single transistor having a drain terminal coupled to the drain node and a source terminal coupled to the source node.

8. The current regulator as claimed in claim 1, wherein the current cells comprise at least one binary cell, the binary cell comprising a set of transistors coupled in series, wherein a first transistor in the set of transistors is coupled to the drain node and wherein a last transistor in the set of transistors is coupled to the source node.

9. The current regulator as claimed in claim 1, comprising a decoder coupled to the current steering circuit; the decoder being configured to provide a plurality of control signals to operate the current cells.

10. The device as claimed in claim 6; wherein the device is a display device comprising a plurality of semiconductor light sources, each semiconductor light source among the plurality of light sources being coupled to a corresponding current regulator.

11. A semiconductor light source driver comprising a current regulator, the current regulator comprising a voltage controller coupled to a current steering circuit having a drain node, a source node, and a plurality of current cells, each current cell having a gate terminal for receiving a control signal to activate the current cell, a drain terminal coupled to the drain node and a source terminal coupled to the source node; the voltage controller being adapted to operate the plurality of current cells of the current steering circuit in a linear mode; wherein the voltage controller comprises a first switch coupled to the source node and, the voltage controller further comprising a current source coupled to the first switch and to a first differential amplifier; the first differential amplifier having an input connected to a drain terminal of the first switch.

12. A method of regulating a current, the method comprising providing a current steering circuit having a drain node, a source node, and a plurality of current cells, each current cell having a gate terminal for receiving a control signal to activate the current cell, a drain terminal coupled to the drain node and a source terminal coupled to the source node; and operating the plurality of current cells of the current steering circuit in a linear mode; providing a voltage controller coupled to the current steering circuit wherein the voltage controller comprises a first switch coupled to the source node, the voltage controller further comprising a current source coupled to the first switch and to a first differential amplifier; the first differential amplifier having an input connected to a drain terminal of the first switch.

13. The method as claimed in claim 12, wherein the first switch has a gate terminal, and a source terminal; and providing a control voltage set above a threshold value to the gate terminal to operate the first switch in linear mode.

14. The method as claimed in claim 13, wherein the first differential amplifier is adapted to provide the control voltage; wherein the first differential amplifier has a reference input for receiving a reference voltage, the first differential amplifier being adapted to maintain the voltage at the drain terminal of the first switch substantially equal to the reference voltage.

\* \* \* \* \*